(12) United States Patent
Anderson et al.

(10) Patent No.: US 8,536,018 B1
(45) Date of Patent: Sep. 17, 2013

(54) MASKLESS INTER-WELL DEEP TRENCH ISOLATION STRUCTURE AND METHODS OF MANUFACTURE

(75) Inventors: Brent A. Anderson, Jericho, VT (US); Andres Bryant, Burlington, VT (US); Josephine B. Chang, Mahopac, NY (US); Michael A. Guillorn, Yorktown Heights, NY (US); Ryoji Hasumi, Crompond, NY (US); Edward J. Nowak, Essex Junction, VT (US); Mickey H. Yu, Essex Jucntion, VT (US)

(73) Assignees: International Business Machines Corporation, Armonk, NY (US); Toshiba America Electronic Components, Inc., Irvine, CA (US)

( * ) Notice: Subject to any disclaimer, the term of this patent is extended or adjusted under 35 U.S.C. 154(b) by 0 days.

(21) Appl. No.: 13/467,314

(22) Filed: May 9, 2012

(51) Int. Cl.
*H01L 27/108* (2006.01)

(52) U.S. Cl.
USPC ........... 438/430; 438/424; 438/149; 438/197; 438/E21.564

(58) Field of Classification Search
USPC .................. 257/E27.112, 347, 368, E21.546, 257/E21.564, 301, 371, 510; 438/430, 424, 438/149, 197, 302, 422, 142, 154, 207, 221
See application file for complete search history.

(56) References Cited

U.S. PATENT DOCUMENTS

| | | | |
|---|---|---|---|
| 5,254,218 A | 10/1993 | Roberts et al. | |
| 5,945,724 A | 8/1999 | Parekh et al. | |
| 6,174,785 B1 | 1/2001 | Parekh et al. | |
| 6,297,127 B1 | 10/2001 | Chen et al. | |
| 6,303,413 B1 | 10/2001 | Kalnitsky et al. | |
| 6,667,226 B2 | 12/2003 | Pinto et al. | |
| 6,933,187 B2 | 8/2005 | Jang | |
| 2005/0106836 A1 | 5/2005 | Chen et al. | |
| 2006/0124982 A1* | 6/2006 | Ho et al. | 257/304 |
| 2007/0249170 A1 | 10/2007 | Kewley | |

* cited by examiner

*Primary Examiner* — Zandra Smith
*Assistant Examiner* — Paul Patton
(74) *Attorney, Agent, or Firm* — Michael LeStrange; Roberts Mlotkowski Safran & Cole, P.C.

(57) ABSTRACT

A low power maskless inter-well deep trench isolation structure and methods of manufacture such structure are provided. A method includes depositing a plurality of layers over a substrate, and forming a layer over the plurality of layers. The method also includes forming well structures in the substrate, and forming sidewall spacers at opposing sides of the layer. The method further includes forming a self-aligned deep trench in the substrate to below the well structures, by removing the sidewall spacers and portions of the substrate aligned with an opening formed by the removal of the sidewall spacers. The method also includes forming a shallow trench in alignment with the deep trench. The method further includes forming shallow trench isolation structures and deep trench isolation structures by filling the shallow trench and the deep trench with insulator material.

19 Claims, 6 Drawing Sheets

MASKLESS INTER-WELL DEEP TRENCH ISOLATION STRUCTURE AND METHODS OF MANUFACTURE

FIELD OF THE INVENTION

The invention relates to semiconductor structures and methods of manufacture and, more particularly, to a low power maskless inter-well deep trench isolation structure and methods of manufacture.

BACKGROUND

Trench isolation structures are used in semiconductors to improve performance of semiconductor devices. More specifically, deep trench isolations are provided to prevent leakage between an N-Well structure and a P-Well structure. In an N-Well structure, a source and a drain of a PFET may be made of boron and in a P-Well structure, a body of an NFET may also be boron. As a result, a PFET adjacent to the body of the P-Well structure may cause parasitic leakage. Similarly, in a P-Well structure, a source and a drain of an NFET may be made of arsenic or phosphorous, and in an N-Well structure, a body of the PFET may also be arsenic or phosphorous. As a result, an NFET adjacent to the body of the N-Well structure may also cause parasitic leakage. That is, adjacent P-Well and N-Well structures suffer from junction leakage, i.e., parasitic leakage.

As such, the respective well structures should be isolated from one another. Accordingly, deep trench isolations (DTI) are used to prevent inter-well leakage. More specifically, deep isolation trenches are used to prevent parasitic leakage between an N-Well structure and a P-Well structure. However, forming deep trench isolations requires many complex and costly fabrication processes, including masking and alignment steps.

Accordingly, there exists a need in the art to overcome the deficiencies and limitations described hereinabove.

SUMMARY

In a first aspect of the invention, a method comprises depositing a plurality of layers over a substrate, and forming a layer over the plurality of layers. The method also comprises forming well structures in the substrate, and forming sidewall spacers at opposing sides of the layer. The method further comprises forming a self-aligned deep trench in the substrate to below the well structures, by removing the sidewall spacers and portions of the substrate aligned with an opening formed by the removal of the sidewall spacers. The method also comprises forming a shallow trench in alignment with the deep trench. The method further comprises forming shallow trench isolation structures and deep trench isolation structures by filling the shallow trench and the deep trench with insulator material.

In another aspect of the invention, a method comprises depositing a plurality of materials over a substrate, and depositing a first oxide layer over the plurality of materials. The method also comprises patterning the first oxide layer to define a pattern with edges, and forming well structures in the substrate, with the edges of the oxide layer acting as alignments. The method further comprises forming sidewall spacers on the edges of the oxide layer, which define a width of self-aligning deep trenches. The method also comprises forming the self-aligning deep trenches aligned with the well structures by removing portions of the substrate extending below the well structures, and forming shallow trenches extending into the substrate to a depth less than a depth of the deep trenches. The method also comprises depositing an oxide material in the shallow trenches and the self-aligning deep trenches to form shallow trench isolation (STI) structures and deep trench isolation (DTI) structures, respectively.

In yet another aspect of the invention, a structure comprises a first well structure of a first type comprising source and drain regions. The structure also comprises a second well structure of a second type comprising source and drain regions. The structure further comprises a shallow trench isolation structure isolating the first well from the second well. The structure also comprises a self-aligned deep trench structure aligned with the shallow trench isolation structure and extending below and between the first well and the second well.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the low power maskless inter-well deep trench isolation, which comprises the structures of the present invention. In still further embodiments, a method in a computer-aided design system is provided for generating a functional design model of the low power maskless inter-well deep trench isolation. The method comprises generating a functional representation of the structural elements of the low power maskless inter-well deep trench isolation.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to a low power maskless inter-well deep trench isolation (DTI) structure and methods of manufacturing the structure. In embodiments, the present invention provides for DTIs which are self-aligned with an N-Well or a P-Well structure.

In implementations, the DTI structure can be formed by using an N-Well image to generate a deep trench at the N-Well periphery using sidewall image transfer techniques. This same process can use a P-Well image to generate a deep trench at the P-Well periphery. Advantageously, by forming the DTI structures without a hardmask, the present invention reduces processing costs and increases processing efficiency. Also, advantageously, the present invention provides for N-Well structures (or P-Well structures) which can be self-aligned with the DTI structures. In this way, the present invention provides for improved DTI and well alignment. This is particularly advantageous as technology nodes shrink, which reduces the area available to form semiconductor devices on a wafer.

Figure 1:
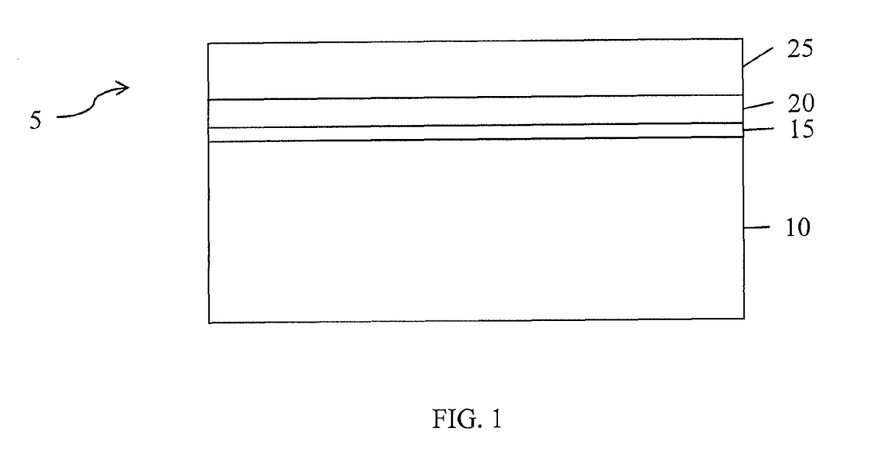
FIG. 1 shows an intermediate structure and respective processing steps in accordance with aspects of the present invention.

FIG. 1 shows an intermediate structure and respective processing steps in accordance with aspects of the present invention. More specifically, FIG. 1 shows a structure 5 having a substrate 10. The substrate 10 can be any conventional substrate such as, for example, a silicon (Si) based wafer. In addition, a pad oxide layer 15 is formed on the substrate 10, and a nitride layer 20 is formed on the pad oxide layer 15. In embodiments, the nitride layer 20 is a silicon nitride layer; although other materials are also contemplated by the present invention. The structure 5 further includes an undoped polysilicon layer 25 formed on the silicon nitride layer 20. The layers shown in FIG. 1 can be formed using any conventional deposition methods, such as chemical vapor deposition (CVD). In embodiments, the layers 15, 20, and 25 could be a combination of different hardmask materials.

Figure 2:
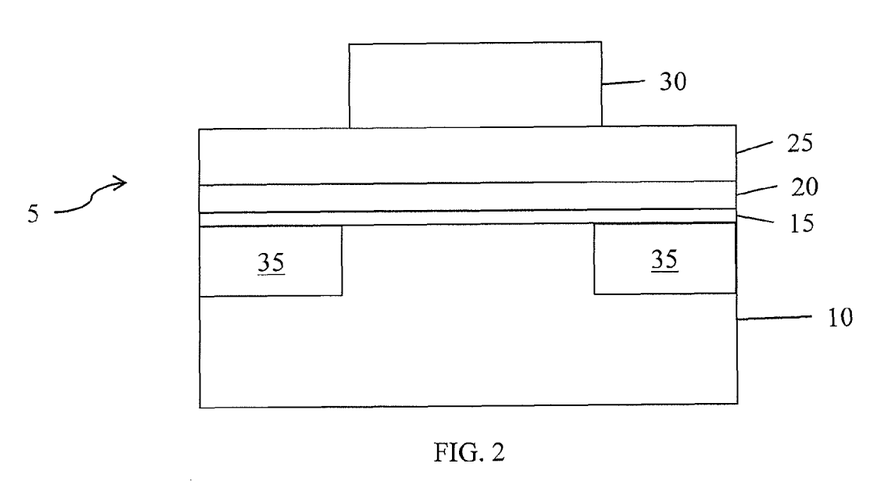
FIGS. 2-9 show structures and respective processing steps in accordance with aspects of the invention.

As shown in FIG. 2, an oxide 30 is formed on the polysilicon layer 25. In embodiments, the oxide layer 30 can be a low temperature oxide (LTO) deposited on the polysilicon layer 25. The LTO 30 can be deposited using any well known deposition process, for example, chemical vapor deposition (CVD), atomic layer chemical vapor deposition (ALCVD), or plasma enhanced chemical vapor deposition (PECVD). In embodiments, the LTO 30 is deposited with a thickness greater than a thickness of the pad oxide layer 15.

As further seen in FIG. 2, the oxide layer 30 is patterned using conventional processes. For example, in embodiments, the patterning process can include depositing a resist on the LTO 30, masking portions of the resist, and exposing the unmasked portions of the resist to light to form a pattern (e.g., openings). The oxide layer 30 may be etched using a conventional reactive ion etching (RIE) process, e.g., an anisotropic etch. In conventional doping or ion implantation processes, e.g., doped epitaxial process, N-Well structures 35 are formed in the substrate layer 10 with an edge of the oxide layer 30 acting as an alignment. It should be understood by those of ordinary skill in the art that, in alternate embodiments, P-Well structures can be formed in the same manner.

Figure 3:
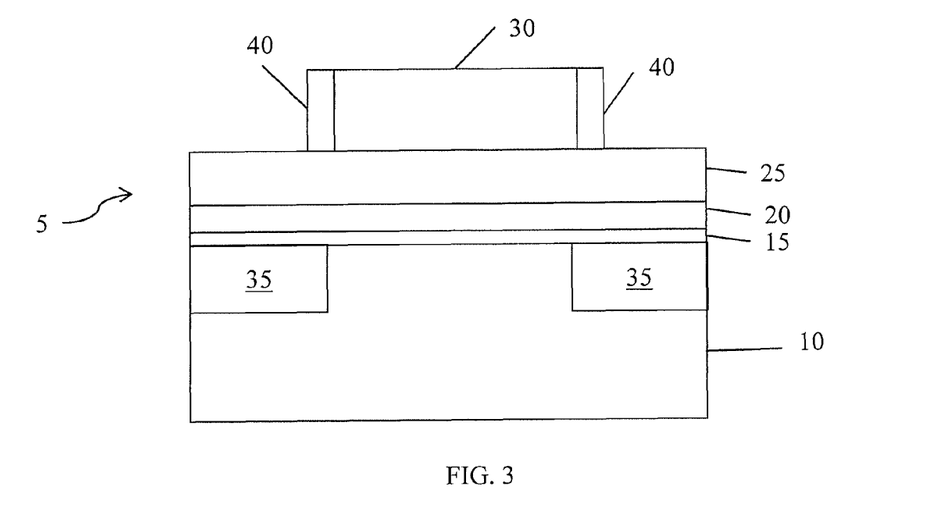

In FIG. 3, after an optional cleaning, sidewall spacers 40 are formed on sides of the etched oxide layer 30. In embodiments, the sidewall spacers 40 are formed with the same material as the nitride layer 20, e.g., silicon nitride. In embodiments, the sidewall spacers 40 are formed by depositing the nitride material on the polysilicon layer 25 and the oxide layer 30 using any conventional deposition process. The material is then etched using an anisotropic etch as should be understood by those of ordinary skill in the art. In embodiments, the sidewall spacers 40 have a width corresponding to a dimension of a DTI structure, formed in subsequent processing steps. For example, in embodiments, the sidewall spacers 40 have a width 50 nm, 100 nm, or 200 nm depending on the technology node; although other dimensions are also contemplated by the present invention.

Figure 4:
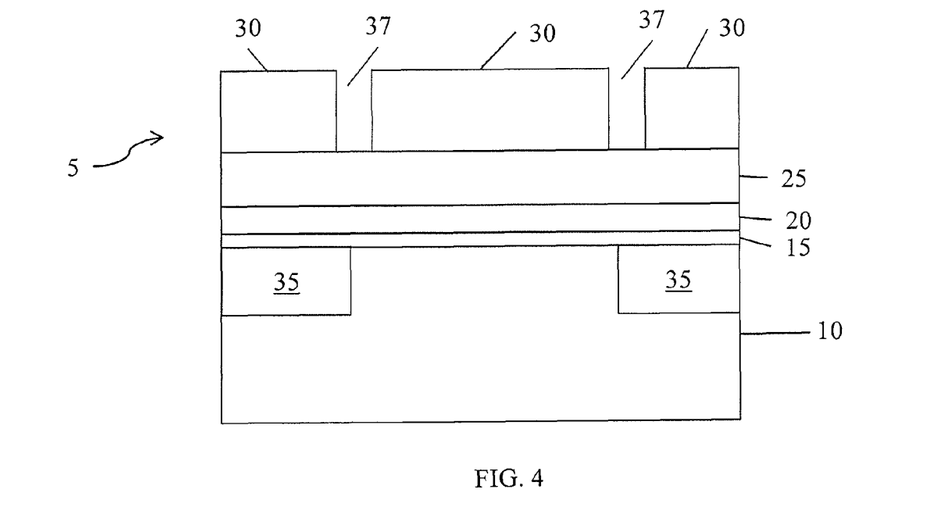

In FIG. 4, an additional layer of oxide 30, e.g. LTO, is formed on the polysilicon layer 25 adjacent to the sidewall spacer 40, on the sidewall spacer 40, and on the oxide layer 30. The oxide layer 30 is then planarized using a chemical-mechanical polishing (CMP) as should be understood by those of ordinary skill in the art. The sidewall spacers 40 can then be removed by selective etching using a wet chemistry etch, e.g. HF. In this way, the sidewall spacers 40 are removed without etching the oxide layer 30 or underlying layers, e.g., pad oxide layer 15, nitride layer 20, and undoped polysilicon layer 25. As a result of removing the sidewall spacers 40, openings 37 are formed to define an opening for DTI structures formed in subsequent processing steps. In this way, the N-Well structures 35 (or P-Well structures) can be self-aligned with the DTI structures.

Figure 5:
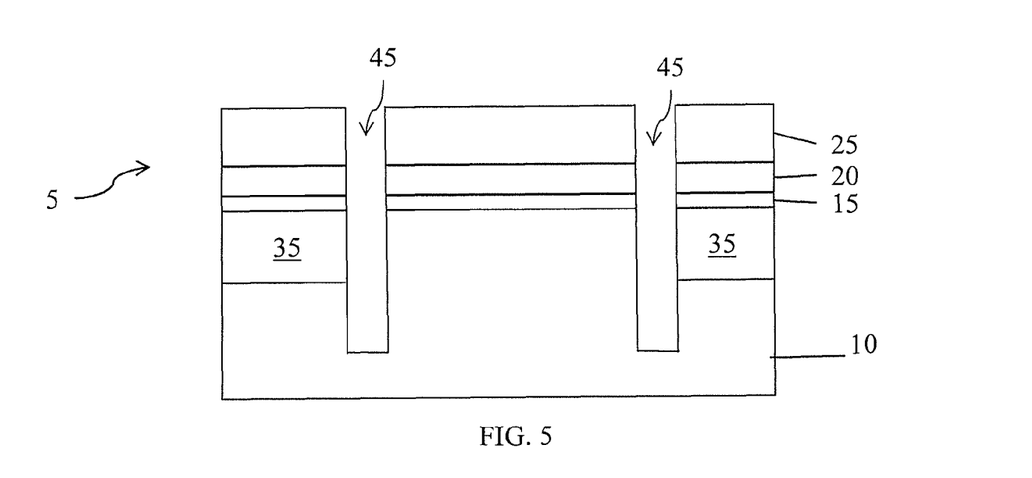

As shown in FIG. 5, after the sidewall spacers have been removed, deep trenches 45 are formed using a reactive ion etching (RIE) process. More specifically, the undoped polysilicon layer 25, the silicon nitride layer 20, the pad oxide layer 15, and portions of the wafer 10 are selectively etched to form the deep trenches 45. In embodiments, the deep trenches 45 extend into the wafer 10, providing a mechanism for ideal isolation to prevent parasitic leakage. In embodiments, a selective etch used to remove the pad oxide layer 15 may also remove some of the oxide layer 30; however, this will not significantly affect the processes herein, as the oxide layer 30 is deposited with a thickness greater than the thickness of the pad oxide layer 15. In further embodiments, if the oxide layer 30 is fully removed, the etchant used to remove the oxide layers, e.g., pad oxide layer 15 and oxide layer 30, will stop at the undoped polysilicon layer 25 and/or the nitride layer 20 before reaching the wafer 10. Furthermore, in embodiments, any remaining portion(s) of the oxide layer 30 is subsequently stripped using any conventional technique after the deep trenches 45 are formed.

Figure 6:
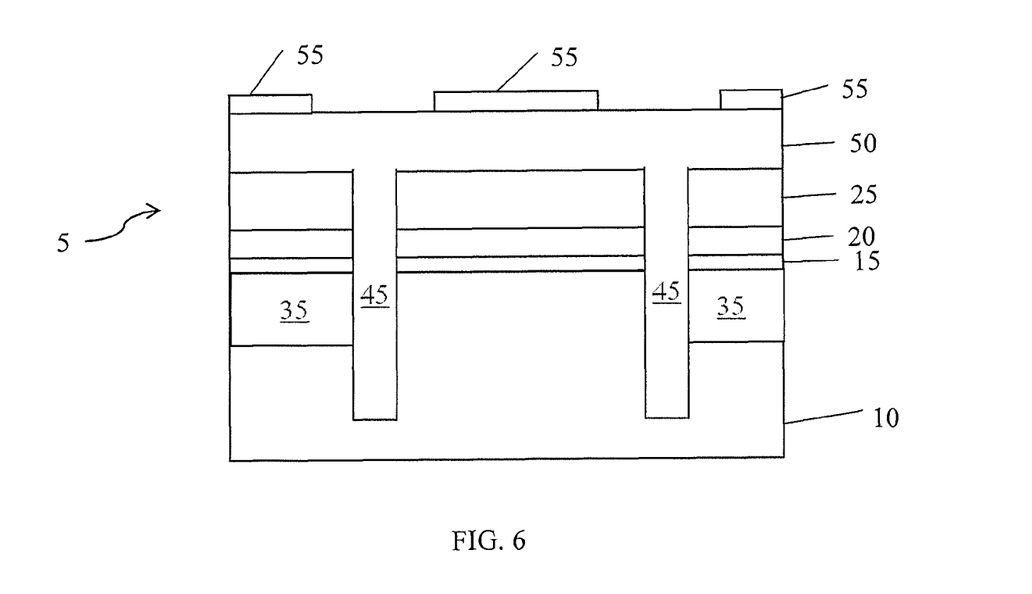

As shown in FIG. 6, a material 50 is deposited within the deep trenches 45. During this deposition process, the material 50 is also deposited on exposed portions of the polysilicon layer 25. In embodiments, the material 50 can be a non-conductive material, such as a near frictionless carbon (NFC). In embodiments, the NFC 50 is a polymer underlayer or organic planarizing material, e.g., any spin on polymer which planarizes the surface of a wafer and has etch resistance similar or superior to a photoresist. In embodiments, the material 50 can be based on poly-hydroxystyrene, napthalene, anthracene, and calixarenes, etc. The material 50 can be deposited using any conventional deposition method, which will not cause pinch off of the deep trench 45. For example, material 50 can be deposited using atomic layer deposition (ALD), as one example. A mask layer 55 is formed on the material 50. In embodiments, the mask layer 55 may be patterned and etched using any well-known technique.

Figure 7:
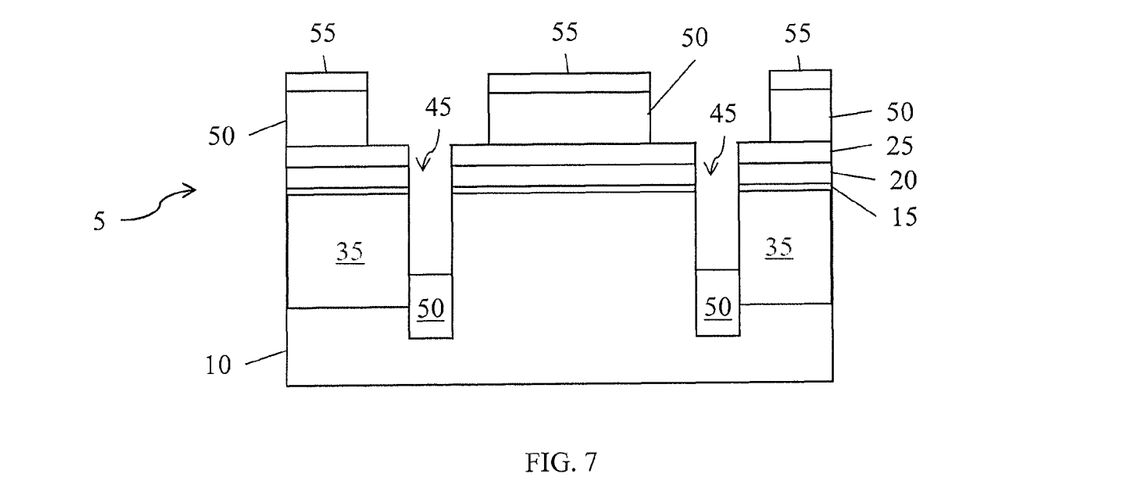

As shown in FIG. 7, the mask layer 55 is used to pattern the material 50 to define shallow trenches, formed in subsequent processing steps. For example, the material 50 may be etched using electron-beam lithography (EBL) with hydrogen silsesquioxane (HSQ). As should be understood by one of ordinary skill in the art, HSQ is a resist that is sensitive to extreme ultraviolet lithography (EUV) and electron-beam lithography (EBL), and converts to an oxide-like film upon exposure to light. The HSQ is also a negative tone. In embodiments, the unmasked or unprotected material 50 is removed using any conventional etching technique, e.g., wet etching. In embodiments, when the material 50 is removed, portions of the material 50 remain in the deep trenches 45 to prevent further etching of the deep trenches 45 during subsequent processing steps.

Figure 8:
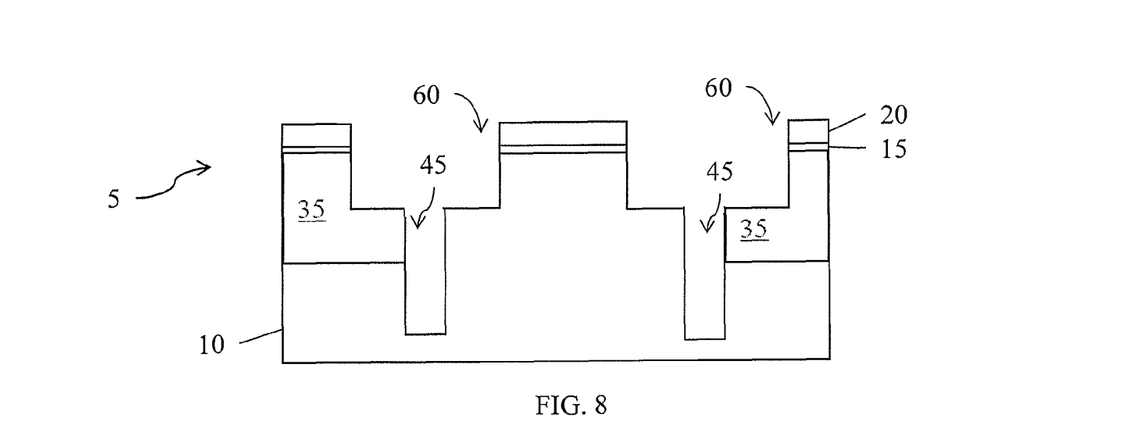

In FIG. 8, shallow trenches 60 are formed by a conventional etching process (RIE). More specifically, the shallow trenches 60 are formed by etching the polysilicon layer 25, the nitride layer 20, the pad oxide layer 15, portions of the N-Well structures 35 and the wafer 10. In embodiments, the shallow trenches 60 extend into the wafer 10 to a depth less than a depth of the deep trenches 45, and are in alignment with the deep trenches 45. In addition, in embodiments, the RIE process removes the remaining material 50 from the deep trenches 45. The mask layer 55 and portions of the material 50 underneath the mask layer 55 are also removed using conventional techniques. In embodiments, the deep trenches 45 are now aligned with the N-Well structures 35. Also, the deep trenches 45 extend into the substrate 10, below the N-Well structures 35.

Figure 9:
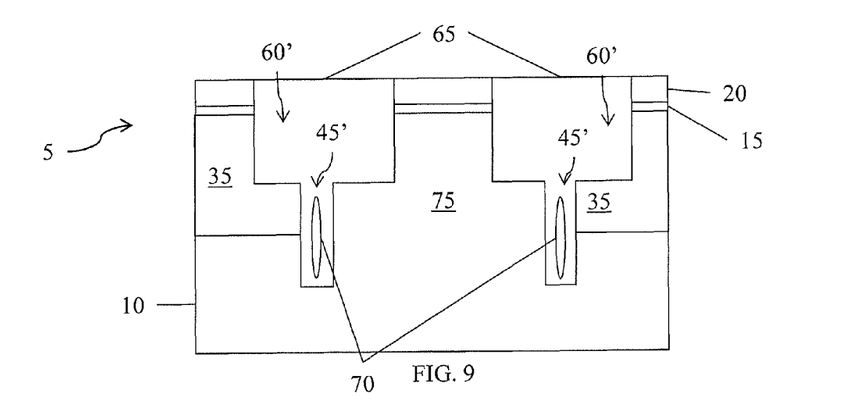

In FIG. 9, an oxide material 65 is deposited in the shallow trenches 60 and deep trenches 45 to simultaneously form shall trench isolation (STI) structures 60' and deep trench isolation (DTI) structures 45'. More specifically, in embodiments, the oxide material 65 is deposited using high-density plasma (HDP). In embodiments, the oxide material 65 can also be deposited using a high-aspect-ratio process (HARP). In embodiments, the oxide material 65 fills portions of the deep trenches 45; however, in embodiments, due to the narrow width of the deep trenches, the oxide material 65 may be pinched-off, thus resulting in voids 70. Subsequently, the oxide material 65 is planarized using a CMP process. In subsequent processing, a P-Well structure is formed in a region 75 between the DTI structures 45'. It should be understood by those of ordinary skill in the art that when the DTI structures 45' are self-aligned with the wells, the DTI structures 45' provide separation between N and P regions, thus preventing any parasitic leakage.

Figure 10:
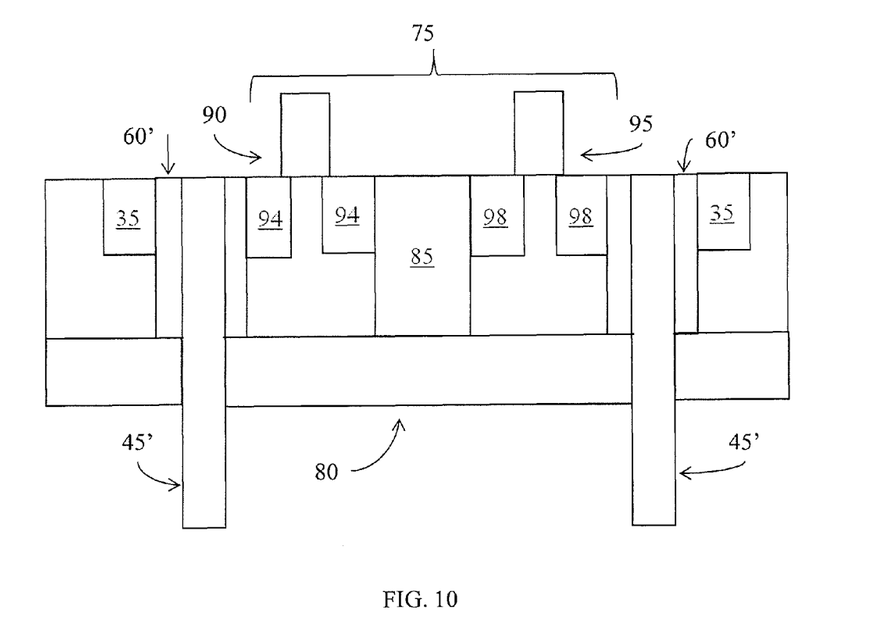
FIG. 10 shows a P-Well structure formed between deep trench isolations in accordance with aspects of the invention.

FIG. 10 shows a P-Well 80 formed in region 75 between the DTI structures 45'. More specifically, the P-Well 80 includes a shallow trench isolation (STI) 85 formed in the substrate 10. In embodiments, the STI 85 provides isolation between adjacent gates 90, 95, and is formed using conventional etching and deposition processes, e.g., dielectric materials, e.g., silicon dioxide ($Si_{O2}$). Sources and drains 94, 98 are formed in the portions of the substrate layer 10 below the gates 90, 95 by ion implantation or other conventional doping techniques, e.g., using a doped epitaxial process.

In embodiments, a source and a drain of a PFET in the N-Well 35 may be made of boron and a body of an NFET in the P-Well 80 may also be boron. Similarly, sources and drains 94, 98 of an NFET in the P-Well 80 may be made of arsenic or phosphorous, and a body of a PFET in the N-Well 35 may also be arsenic or phosphorous. As a result, parasitic leakage may occur between the boron in the source/drain of the N-Well and the body of the NFET in the P-Well and between the arsenic/phosphorous in the source/drain of the P-Well and the body of the PFET in the N-Well. That is, adjacent P-Well and N-Well structures suffer from parasitic leakage. However, in embodiments, the DTI structures 45' are self-aligned and etched to a depth such that the DTI structures 45' prevent parasitic leakage between the N-Well 35 and the P-Well 80.

Figure 11:
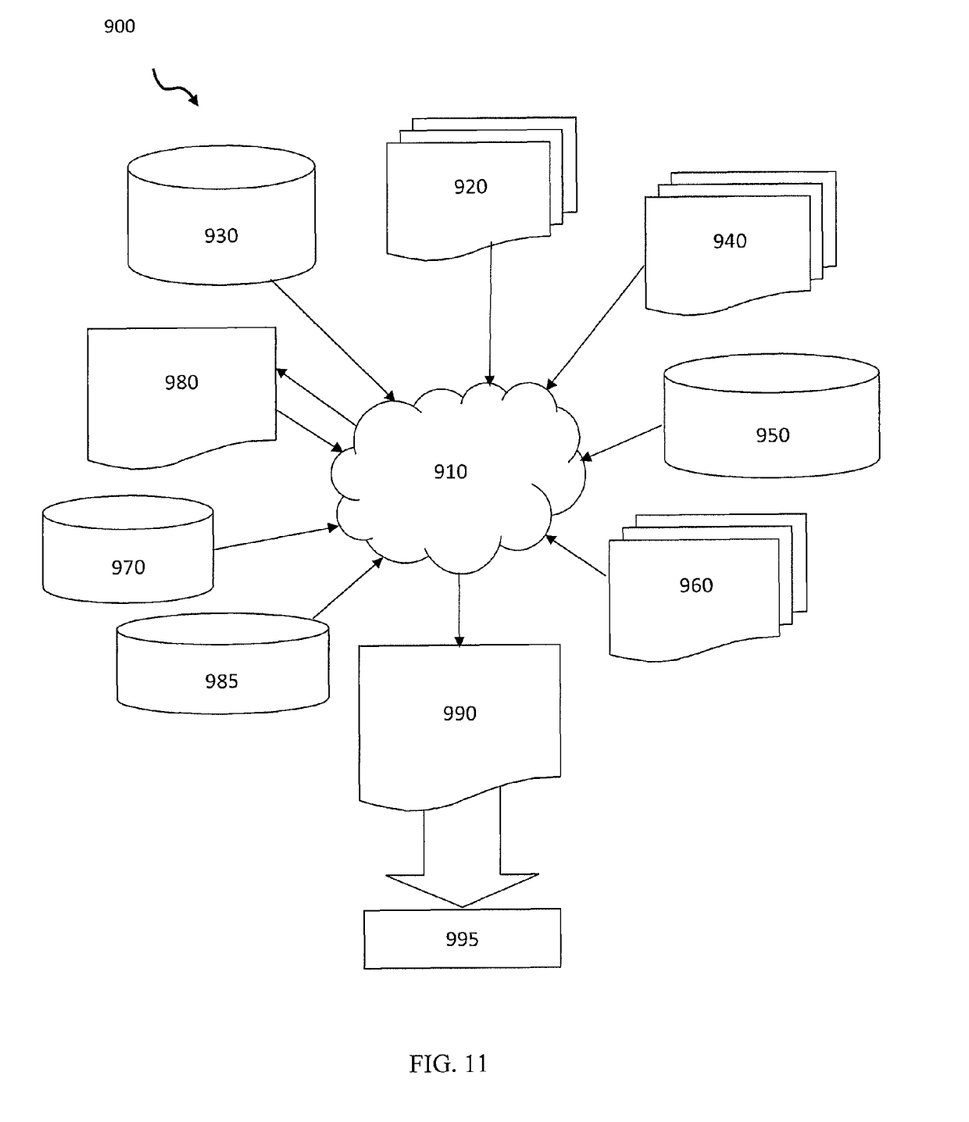
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-10. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-10. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-10 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-10. In one embodiment, design structure 990 may comprise a compiled, executable HDL simulation model that functionally simulates the devices shown in FIGS. 1-10.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   depositing a plurality of layers over a substrate;
   forming a layer over the plurality of layers;
   forming well structures in the substrate;
   forming sidewall spacers at opposing sides of the layer;
   forming a self-aligned deep trench in the substrate to below the well structures, by removing the sidewall spacers and portions of the substrate aligned with an opening formed by a removal of the sidewall spacers;
   forming a shallow trench in alignment with the deep trench; and
   forming shallow trench isolation structures and deep trench isolation structures by filling the shallow trench and the deep trench with insulator material.

2. The method of claim 1, wherein the plurality of layers include:
   a pad oxide layer formed on the substrate;
   a nitride layer formed on the pad oxide layer; and
   a polysilicon layer formed on the nitride layer.

3. The method of claim 1, further comprising forming a second layer on a side of the sidewall spacers and over the plurality of layers, wherein:
   forming the layer comprises:
      depositing a first oxide layer; and
      patterning the first oxide layer;
   forming the second layer comprises:
      depositing a second oxide layer on the sidewall spacers, and over exposed portions of the plurality of layers and the first oxide layer; and
      planarizing the second oxide layer such that the sidewall spacers are exposed; and
   forming the self-aligned deep trench comprises:
      providing an opening by removing the sidewall spacers; and
      selectively etching the plurality of layers and the substrate, through the opening.

4. The method of claim 3, wherein forming the shallow trench comprises:
   removing the first oxide layer and the second oxide layer to expose an upper layer of the plurality of layers;

depositing material within the deep trench and over exposed portions of the upper layer of the plurality of layers;

patterning the material to form an opening, in alignment with the deep trench; and removing the plurality of layers and the substrate through the opening of the material.

5. The method of claim 4, wherein the patterning removes the material from the deep trench.

6. The method of claim 4, wherein the deposited material is a non-conductive material.

7. The method of claim 6, wherein the non-conductive material is near frictionless carbon (NFC).

8. The method of claim 6, wherein forming the shallow trench further comprises removing portions of the well structure.

9. The method of claim 6, wherein forming the shallow trench removes the non-conductive material in the deep trench.

10. The method of claim 1, wherein the insulator material is a deposited oxide material in the shallow trench and the deep trench.

11. The method of claim 10, wherein the oxide material is deposited using a high-density plasma (HDP) process or a high-aspect-ration process (HARP).

12. A method, comprising:

depositing a plurality of materials over a substrate;

depositing a first oxide layer over the plurality of materials;

patterning the first oxide layer to define a pattern with edges;

forming well structures in the substrate, with the edges of the oxide layer acting as alignments for the well structures;

forming sidewall spacers on the edges of the oxide layer, which define a width of self-aligning deep trenches;

forming the self-aligning deep trenches aligned with the well structures by removing portions of the substrate extending below the well structures;

forming shallow trenches extending into the substrate to a depth less than a depth of the deep trenches; and depositing an oxide material in the shallow trenches and the self-aligning deep trenches to form shallow trench isolation (STI) structures and deep trench isolation (DTI) structures, respectively.

13. The method of claim 12, wherein the forming the deep trenches comprises:

forming a second oxide layer on a top surface of the plurality of materials, the sidewall spacers, and the first oxide layer;

planarizing the second oxide layer to expose the sidewall spacers;

removing the sidewall spacers to form openings; and selectively etching the plurality of layers and the substrate to form deep trenches.

14. The method of claim 13, further comprising:

stripping the first oxide layer and the second oxide layer;

depositing a non-conductive material in the deep trenches;

forming a mask layer on the non-conductive material; and etching exposed portions of the non-conductive material to define an opening for the shallow trenches.

15. The method of claim 14, wherein portions of the non-conductive material remain in a bottom portion of the deep trenches after the etching.

16. The method of claim 14, wherein forming the shallow trenches removes the non-conductive material in a bottom portion of the deep trenches.

17. The method of claim 12, wherein the plurality of materials include:

a pad oxide layer formed on the substrate;

a nitride layer formed on the pad oxide layer; and a polysilicon layer formed on the nitride layer.

18. The method of claim 17, wherein the plurality of materials act as hardmasks during selective removal of material within the deep trenches.

19. The method of claim 12, wherein the DTI structures are self-aligned with the well structures.

* * * * *